United States Patent
Tuttobene et al.

(10) Patent No.: US 6,757,632 B2
(45) Date of Patent: Jun. 29, 2004

(54) METHOD AND APPARATUS FOR TESTING INTEGRATED CIRCUITS USING A SYNCHRONIZATION SIGNAL SO THAT ALL MEASUREMENTS ARE ALLOTTED A TIME SLOT OF THE SAME LENGTH

(75) Inventors: Giuseppe Tuttobene, Valguarnera (IT); Giuseppe Di Gregorio, Sant'Agata li Battiati (IT); Biagio Russo, Tremestieri Etneo (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 0 days.

(21) Appl. No.: 10/175,685

(22) Filed: Jun. 20, 2002

(65) Prior Publication Data

US 2002/0198674 A1 Dec. 26, 2002

(30) Foreign Application Priority Data

Jun. 21, 2001 (EP) .......................................... 01830417

(51) Int. Cl.⁷ .............................................. G01R 31/28
(52) U.S. Cl. ...................... 702/117; 702/125; 702/120; 324/765
(58) Field of Search .......................... 702/117–121, 58, 702/59, 124–126, 177, 183, 187, 189, 123, FOR 103, FOR 104, FOR 134, FOR 170, FOR 171; 714/31, 32, 724, 726, 731, 738–740, 742, 744; 324/765, 73.1

(56) References Cited

U.S. PATENT DOCUMENTS

| | | | |
|---|---|---|---|
| 5,398,197 A | 3/1995 | Ogata et al. | ............... 702/119 |
| 5,894,424 A | 4/1999 | Motohama et al. | ......... 702/117 |
| 6,363,507 B1 * | 3/2002 | Truebenbach et al. | ...... 714/734 |
| 6,466,007 B1 * | 10/2002 | Prazeres da Costa et al. | ... 324/158.1 |
| 6,512,989 B1 * | 1/2003 | Deome et al. | .............. 702/124 |

OTHER PUBLICATIONS

European Search Report dated Jan. 16, 2002 for European Application No. 01830417.

* cited by examiner

Primary Examiner—Hal D Wachsman
(74) Attorney, Agent, or Firm—Lisa K. Jorgenson; Stephen Bongini; Fleit, Kain, Gibbons, Gutman, Bongini & Bianco P.L.

(57) ABSTRACT

A method is provided for testing an integrated circuit in an automatic test environment. According to the method, the automatic test environment is set up, and there is performed a repetitive measurement of at least one electrical quantity representative of an integrated circuit response to a set of prescribed integrated circuit test conditions. The automatic test environment is reset, and the integrated circuit test conditions are changed in synchrony with a synchronization signal having a prescribed periodicity, so that all of the measurements are allotted a time slot of the same length. Also provided is an automatic test equipment apparatus that includes a synchronization generator for supplying a synchronization signal having a prescribed periodicity to means for putting the integrated circuit in a set test condition. The means changes the set test condition in synchrony with the synchronization signal, so that all of the measurements are allotted a time slot of the same length.

21 Claims, 8 Drawing Sheets

METHOD AND APPARATUS FOR TESTING INTEGRATED CIRCUITS USING A SYNCHRONIZATION SIGNAL SO THAT ALL MEASUREMENTS ARE ALLOTTED A TIME SLOT OF THE SAME LENGTH

CROSS-REFERENCE TO RELATED APPLICATIONS

This application is based upon and claims priority from prior European Patent Application No. 01-830417.0, filed Jun. 21, 2001.

BACKGROUND OF THE INVENTION

1. Field of the Invention

The present invention relates to integrated circuit testing and measurement, and more specifically to the testing and measurement of integrated circuits in an automated test environment.

2. Description of Related Art

Testing and measurement is an important phase in integrated circuit design and manufacturing. Albeit the specific tests and measurements to be conducted vary greatly depending on the type of integrated circuit and the function or functions it is intended to perform, it is in general necessary to check for the absence of faults and the compliance of the circuit with the desired specifications. To do this, a relatively high number of measurements in several operating conditions is conducted.

Normally this is done in an Automatic Test Environment ("ATE"), programmed to perform several measurements in different operating conditions on specified electrical quantities, which are useful to provide a characterization of the integrated circuit, by means of a sampler instrumentation.

A large number of acquisitions by the sampler instrumentation is required. Generally stated, each acquisition is made up of five steps. A first step provides for setting up all the instruments involved in the measurement A second step provides for setting the test conditions for the integrated circuit to be tested. In a third step the sampler instrumentation performs the actual acquisition (i.e., it samples the specified electrical quantities so as to measure the integrated circuit response to the set test conditions). In a fourth step mathematical calculations are performed on the acquired data. In a fifth step all the instruments are reset.

Clearly, the test time rapidly increases with the number of acquisitions to be performed, that is with the number of different test condition setups. Up to now, two techniques have been followed in order to perform these kind of measurements.

A first technique, illustrated by a flowchart in FIG. 1, can be referred to as "multi-acquisition". According to this technique, all five steps outlined above have to be repeated for each measurement to be conducted on the integrated circuit, that is for each test condition setup. Referring to FIG. 1, after all the instruments involved in the measurement have been set up (block 11, "STUP INSTR"), an analog time acquisition routine (sampling routine) is started (block 12, "T ACQ STRT"). The integrated circuit under test is then put in a prescribed test condition setup (block 13, "SET COND"). Such test condition setup is chosen from a set of test condition setups corresponding to several tests to be conducted on the integrated circuit. During the sampling routine the sampler instrumentation samples the specified integrated circuit characteristic quantities so as to acquire the response of the integrated circuit to the programmed test condition setup (block 14, "MEAS"). Once the integrated circuit response has been acquired, the analog time acquisition routine is stopped (block 15, "T ACQ STOP"). Mathematical calculations are then performed on the acquired data (block 16, "MTH CALC") and finally the measurement instruments are reset (block 17, "RST INSTR").

The above steps are repeated until all the test condition setups have been implemented (block 18, "LST?").

The advantage of the multi-acquisition technique resides in its ease of implementation and in the possibility of predicting the overall test time given a set of test condition setups. However, this technique is inherently time consuming, due to the need for repeating the five steps for each test condition setup. Considering that each chip of the integrated circuit coming out from manufacturing has to be tested, the time needed to perform the integrated circuit testing and measurement severely impacts the overall production cost, especially in large scale production.

A second technique, illustrated by the flowchart of FIG. 2, can be defined as "single acquisition". According to this technique, the sampler instrumentation is started at the beginning of the testing and measurement program to start the acquisition. All the test condition setups are then sequentially implemented. The sampler instrumentation is stopped when all the test condition setups have been implemented. Referring to FIG. 2, after all the instruments involved in the measurement have been set up (block 21, "STUP INSTR"), an analog time acquisition routine (sampling routine) is started (block 22, "T ACQ STRT"). The integrated circuit is then put in a prescribed test condition setup (block 23, "SET COND"). Again, such test condition setup is chosen from a set of test condition setups corresponding to several tests to be conducted on the integrated circuit. The sampler instrumentation samples the characteristic quantities of the integrated circuit so as to acquire the response of the integrated circuit to the test condition setup (block 24, "MEAS"). The operations corresponding to blocks 23 and 24 are repeated until all the test condition setups have been implemented (block 25, "LST?").

Once the integrated circuit response to all the test condition setups has been acquired, the analog time acquisition routine is stopped (block 26, "T ACQ STOP"). Mathematical calculations are then performed on the acquired data (block 27, "MTH CALC") and finally the instruments are reset (block 28, "RST INSTR").

Compared to the multi-acquisition technique, the single acquisition technique has the advantage of saving time, because the starting and stopping of the sampling routine, the setting up of the instruments involved in the measurement and the mathematical calculations have to be performed only once.

However, it has been observed that this technique also has some drawbacks. The drawbacks of this technique reside in the instability in time acquisition, since the time of absence of signal on the quantities under measure (i.e., the time during the switch between different test condition setups) varies when switching between different pairs of test condition setups. For example, FIG. 3 is a diagram showing the response R (in mV) of an integrated circuit to six different test condition setups, for instance the response R on six different channels CH1–CH6 of a programmable Radio–Frequency (RF) integrated circuit having several different channels which all must be tested. The abscissa represents the number of samples S acquired by the sampler instrumentation. As shown, the time of absence of signal differs when switching between different pairs of channels. It is therefore difficult, if not impossible, to determine whether the sampled data relate to an effective integrated circuit response to a given test condition setup, or to a time interval between two different test condition setups. This problem becomes more and more significant with the increase in the number of different test conditions to be implemented.

Another negative consequence of this problem is the unpredictability of the time needed to complete the test program.

Additionally, it has been observed that the repeatability of the measurement between successive runs of the test program on the same integrated circuit is scarce. This is for example shown in FIGS. 4A and 4B which, similarly to FIG. 3, show the response R, in two successive runs of the test program, of six different channels CH1–CH6 of a programmable Radio–Frequency (RF) integrated circuit having several different channels which all must be tested.

SUMMARY OF THE INVENTION

In view of the state of the art, it is an object of the present invention to provide a method for testing integrated circuits that is not affected by the drawbacks of conventional testing and measurement techniques.

One embodiment of the present invention provides a method for testing an integrated circuit in an automatic test environment. According to the method, the automatic test environment is set up, and there is measured at least one electrical quantity representative of an integrated circuit response to a set of prescribed integrated circuit test conditions. The automatic test environment is reset, and the integrated circuit test conditions are changed in synchrony with a synchronization signal having a prescribed periodicity, so that all of the measurements are allotted a time slot of the same length.

Another embodiment of the present invention provides an automatic test equipment apparatus for testing an integrated circuit. The apparatus includes means for putting the integrated circuit in a set test condition, sampling circuitry for measuring a response of the integrated circuit to the test condition, and a synchronization generator coupled to the means. The synchronization generator supplies at least one synchronization signal having a prescribed periodicity to the means, and the means changes the set test condition in synchrony with the synchronization signal, so that all of the measurements are allotted a time slot of the same length.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 5:
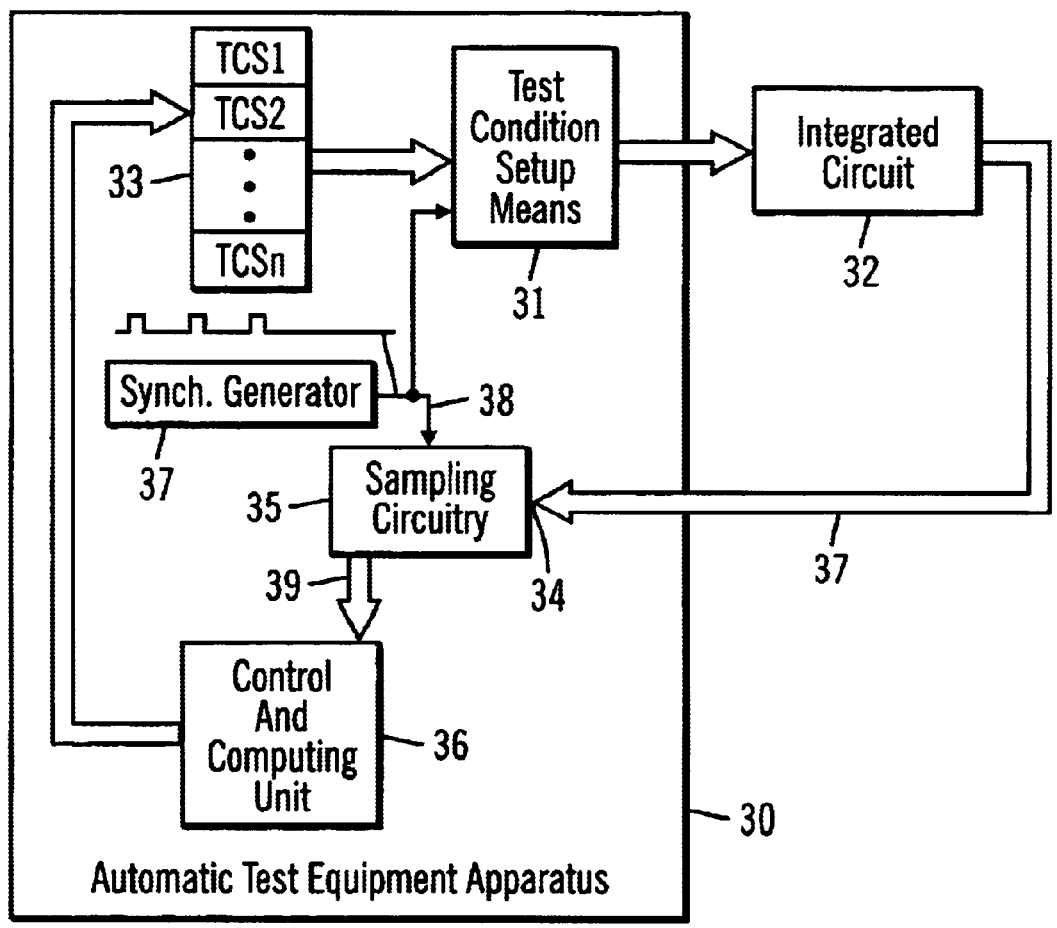
FIG. 5 is a block diagram of an automatic test equipment apparatus adapted for implementing an embodiment of the testing method of the present invention.

FIG. 5 shows a block diagram of an automatic test equipment apparatus 30 adapted to implement an embodiment of the testing method of the present invention. The automatic test equipment apparatus 30 comprises means 31 for putting an integrated circuit under test 32 in a desired test condition setup chosen from among a plurality 33 of test condition setups TCS1–TCSn. The means 31 will not be described in detail since they are known to one of ordinary skill in the art.

The automatic test equipment apparatus 30 also comprises analog inputs 34 connected to sampling circuitry 35. Electrical quantities 37 useful to characterize the response of the integrated circuit 32 to the test condition setup are supplied to the analog inputs 34 of the automatic test equipment apparatus 30.

A test and measurement program runs on a programmable control and computing unit 36, which determines the change of test condition setup for the integrated circuit under test 32. The control and computing unit 36 also elaborates data 39 furnished by the sampling circuitry 35. For example, the control and computing unit 36 performs mathematical calculations on the data.

A synchronization generator 37 generates a synchronization signal or signals 38 for synchronizing the change of test condition setup by the means 31 and the sampling circuitry 35.

Advantageously, in a mixed-signal automatic test equipment apparatus, such as the testers of the Teradyne A5 family, the synchronization generator 37 can be the digital pattern generator embedded in the equipment, and the synchronization signals 38 can thus be provided by the digital outputs of the tester. By specifying a digital pattern, that is a set of values for the vector of digital outputs of the tester, it is possible by means of the digital pattern generator to make one or more of the digital outputs of the tester change state with a prescribed time periodicity.

However, the synchronization generator could also be external to the automatic test equipment, and can for example be an external clock signal generator or digital pattern generator. This is for example the case with an analog automatic test equipment apparatus, which does not have an embedded digital pattern generator.

However, the nature of the synchronization generator is not so limited and the examples described above are not meant to limit the present invention. Any kind of circuit capable of generating a clock signal of sufficiently stable period can in principle be used in accordance with the teachings of the present invention. Additionally, it is not necessary that the synchronization generator is a physical, hardware component; the synchronization signal could alternatively be generated by a software routine, for example by the control and computing unit 36.

Figure 6:
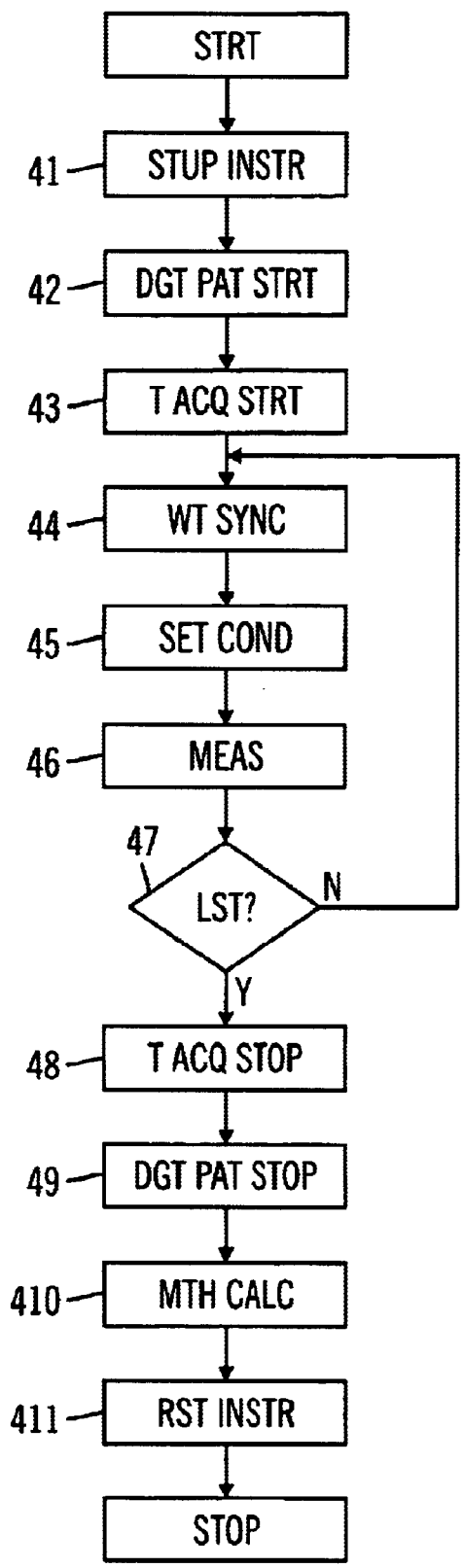
FIG. 6 is a simplified flowchart of an embodiment of the testing method according to the present invention.

FIG. 6 is a simplified flowchart illustrating an embodiment of the testing method according to the present invention. In this embodiment, which is illustrative and not meant to be limiting, the automatic test equipment apparatus 30 is of the mixed-signal type, and the synchronization generator is a digital pattern generator embedded in the automatic test equipment apparatus.

As a first step, the instruments involved in the measurement are set up (lock 41, "STUP INSTR"); in this step all the fixed conditions are programmed. By "fixed conditions" it is meant all those conditions which will not change upon changing the test condition setup.

After having set the instruments up, a digital pattern scan is started (block 42, "DGT PAT STRT"). A digital vector is made to periodically scan a pattern of digital values, one of which is chosen as synchronization digital vector value, with a prescribed time period. This will provide the synchronization signal for changing the test conditions. An analog time acquisition routine (sampling routine) is then started (block 43, "T ACQ STRT").

The synchronization signal is then waited for (block 44, "WT SYNC"). The synchronization signal is a signal derived from the reaching, on the part of the synchronization digital vector, of the synchronization digital vector value.

Upon receiving the synchronization signal, one test condition setup among the set of test condition setups is programmed (block 45, "SET COND"), and the integrated circuit response to the programmed test condition setup is acquired by the measurement instruments, that is the sampling circuitry samples the characteristic electrical quantities representative of the integrated circuit response (block 46, "MEAS").

The operations of blocks 44, 45 and 46 are repeated until all the test condition setups have been implemented (block 47, "LST?").

After the integrated circuit response to all the desired test condition setups has been acquired by the measurement instruments, the analog time acquisition routine (block 48, "T ACQ STOP") and the digital pattern scan (block 49, "DGT PAT STOP") are stopped.

Mathematical calculations are then performed on the acquired data (block 410, "MTH CALC"). The mathematical calculations can for example be a Fast-Fourier Transform (FFT) calculation performed by a Digital Signal Processor (DSP).

The instruments are finally reset (block 411, "RST INSTR").

In the test method according to the present invention, after the response of the integrated circuit to a given test condition setup has been acquired and before putting the integrated circuit in a new test condition setup, the occurrence of a prescribed synchronization signal is waited for.

By using a synchronization signal to change the test condition setup it is possible to establish a prescribed time interval for the measurement (for example the acquisition by the sampling circuitry) of the integrated circuit response to any given test condition setup. This solves the problems of instability and scarce repeatability of the single acquisition technique, without the test time overhead of the multi-acquisition technique.

The period of the synchronization signal is chosen to be sufficiently long enough to allow the integrated circuit to develop a full response to the test condition setup.

In particular, assuming the use of a digital pattern generator as synchronization generator, the synchronization signal can be derived from the reaching of a prescribed synchronization digital vector value by a digital vector periodically scanning a pattern of digital vector values. The use of a digital pattern generator is particularly advantageous in mixed-signal automatic test equipment, which already has such a functionality embedded.

Since in mixed-signal automatic test equipment it is possible to generate a digital pattern with very high stability in terms of scanning frequency, the stability of the synchronization signal is assured.

The inventors have experimented with the test method described above, as well as the conventional test methods, in the testing of a Radio-Frequency (RF) integrated circuit transceiver for a DECT (Digital Enhanced Cordless Telecommunications) system having a frequency band from 1881.8 MHz to 1930.2 MHz and twenty-nine channels to be individually tested.

Figure 1:
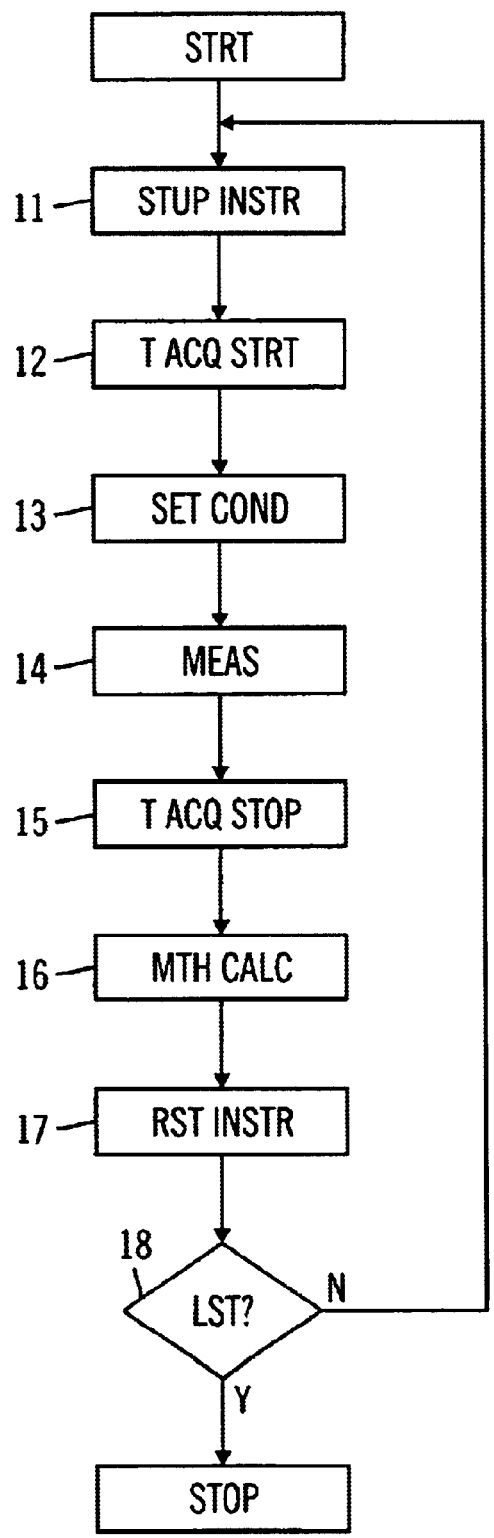
FIG. 1 is a simplified flowchart of a test program according to the conventional multi-acquisition technique.
Figure 2:
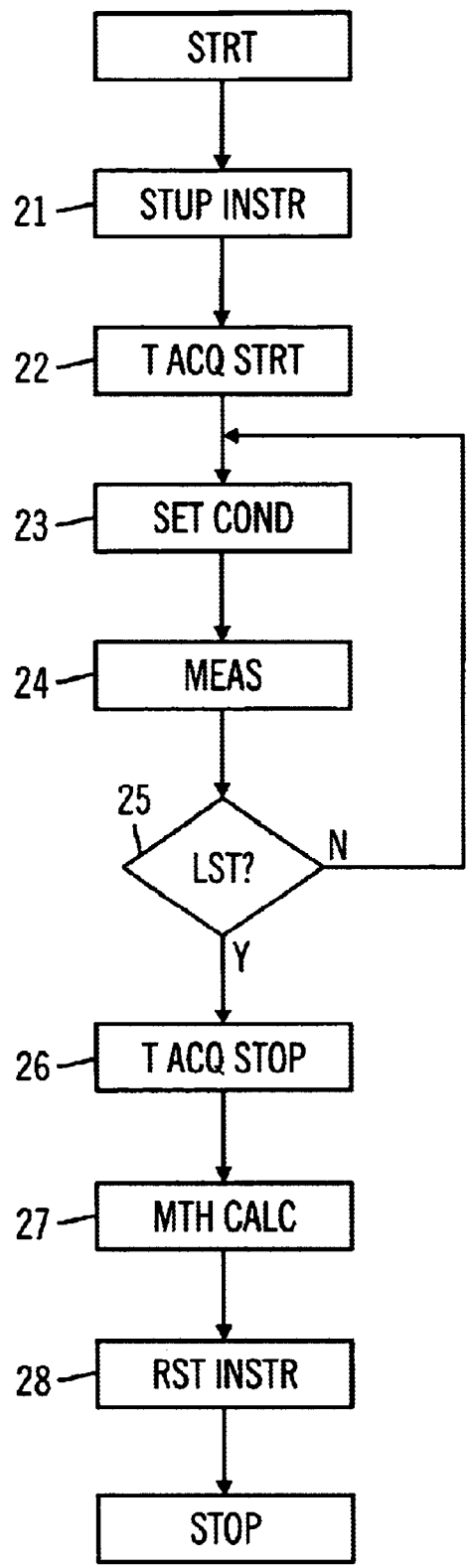
FIG. 2 is a simplified flowchart of a test program according to the conventional single acquisition technique.
Figure 3:
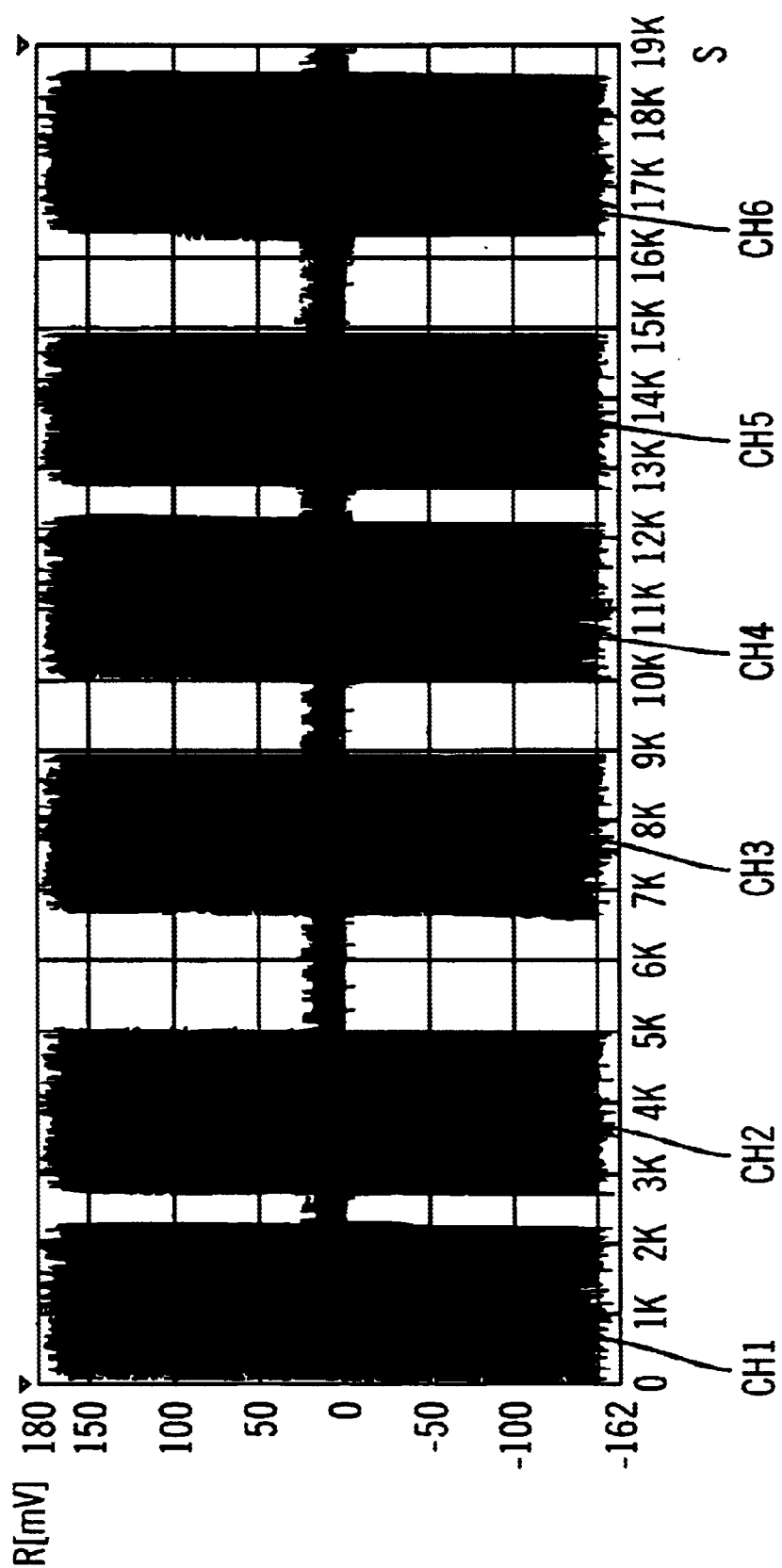
FIG. 3 is a timing diagram of a characteristic quantity of an integrated circuit submitted to a test program according to the single acquisition technique of FIG. 2.
Figure 4A:
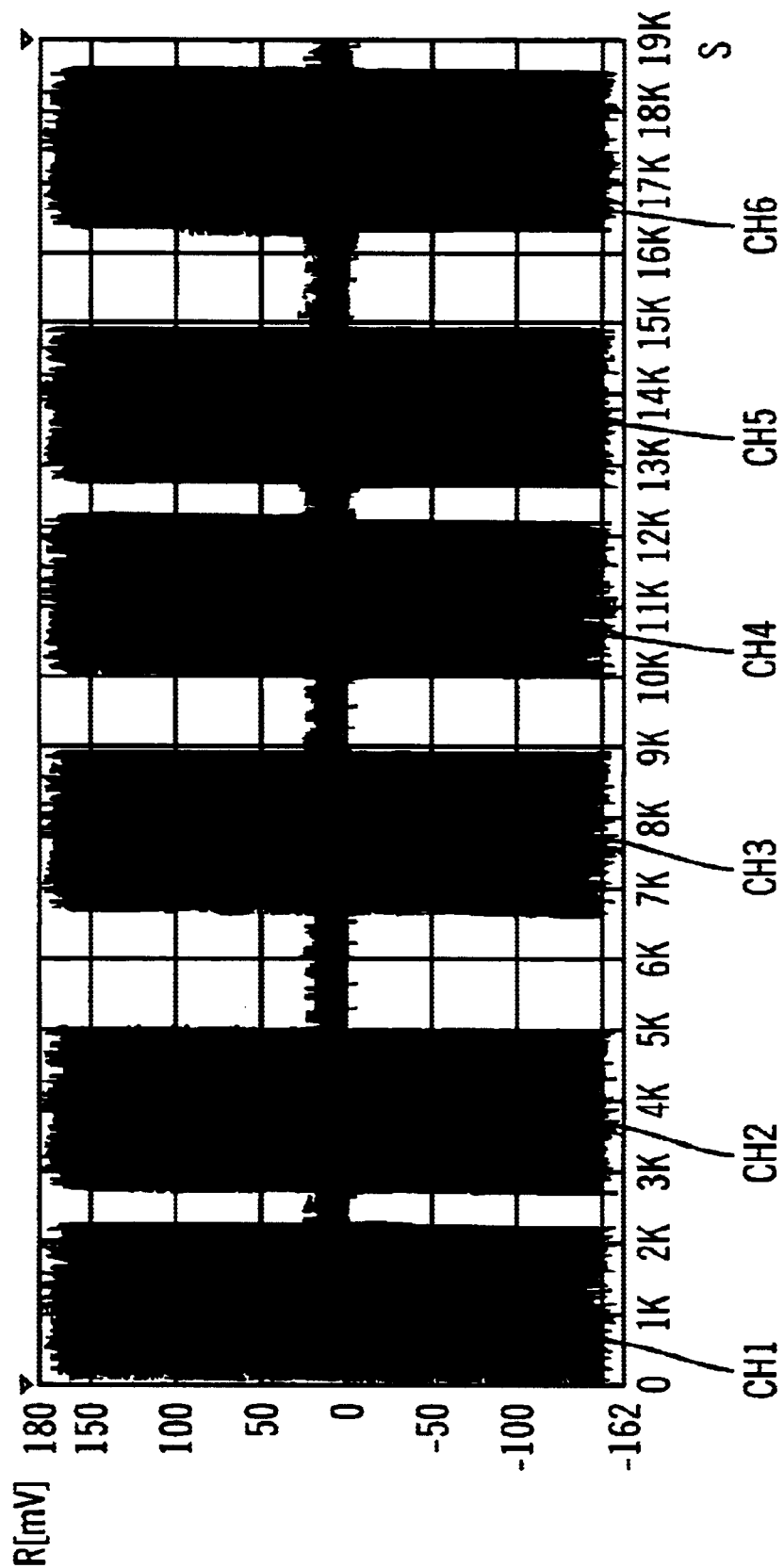
FIGS. 4A and 4B are timing diagrams of a characteristic quantity of an integrated circuit in two successive runs of a test program according to the single acquisition technique of FIG. 2.
Figure 4B:
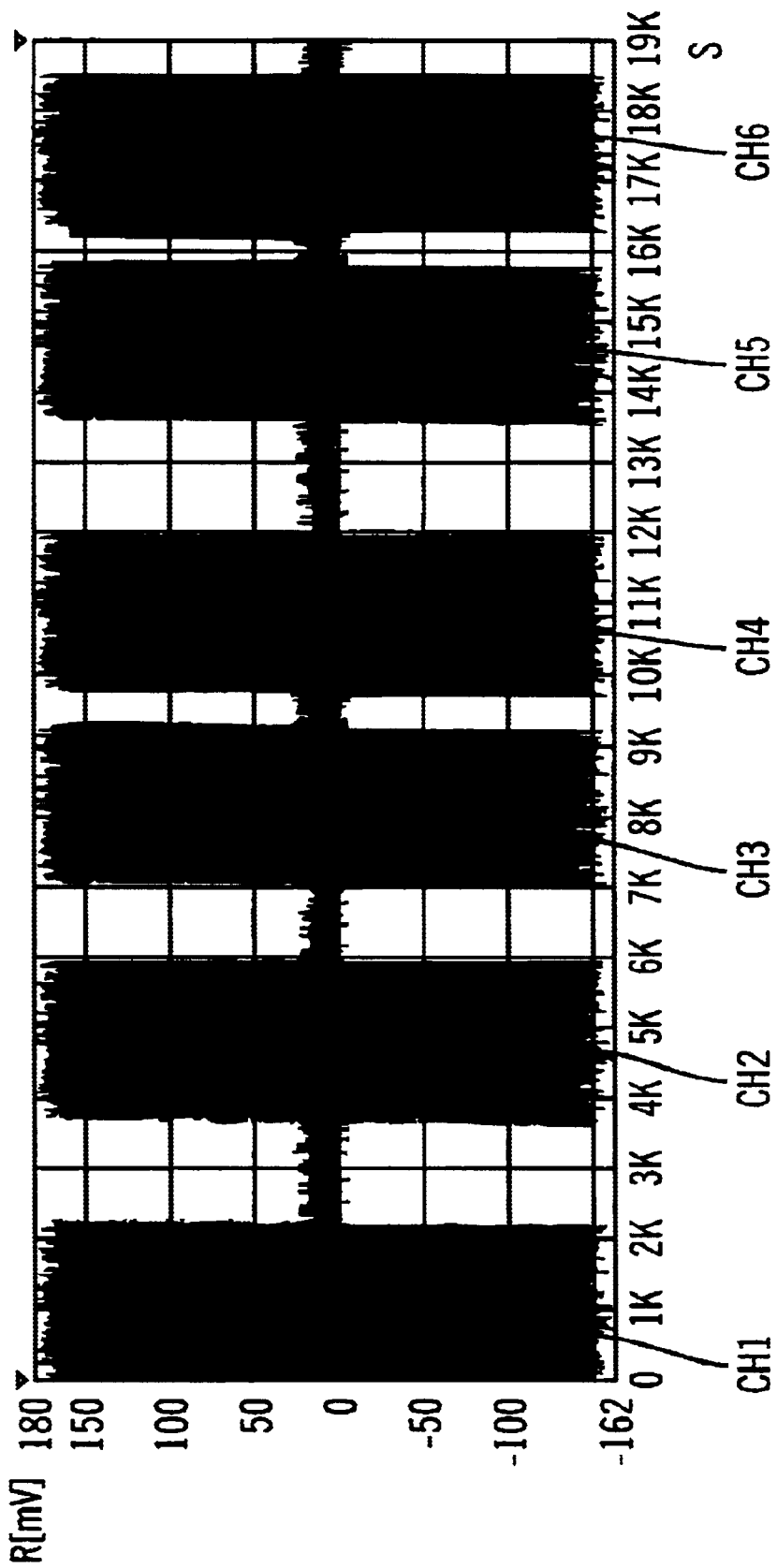
Figure 7:
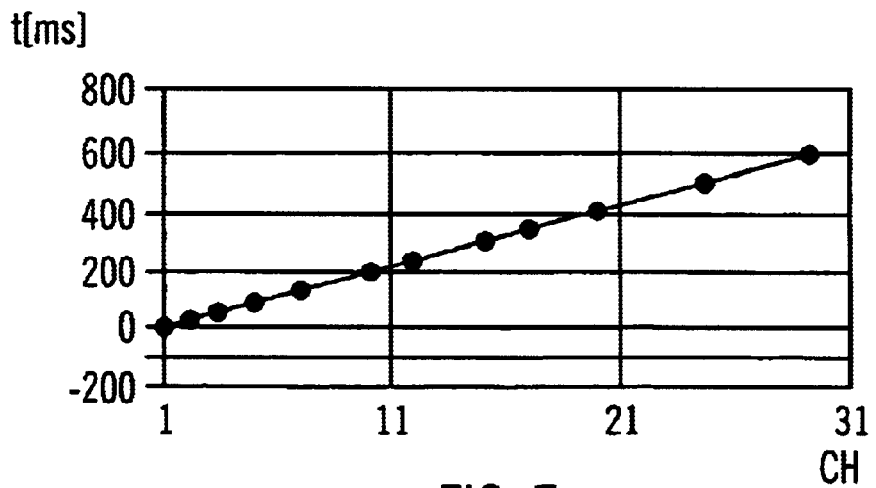
FIG. 7 is a diagram showing the test time saving allowed by an embodiment of the testing method of the present invention with respect to the multi-acquisition technique.

The inventors have experimentally found that in both the multi-acquisition and the single acquisition techniques, the test time increases roughly linearly with the number of channels; in the case of the single acquisition technique this holds true when the number of channels to be tested is sufficiently large so that the portion of the test time necessary to set the instruments up and for setting the fixed conditions (block 21 in FIG. 2) is not preponderant. However, the slope of the test time versus number of channels line in the case of the multi-acquisition technique is higher (approximately 28 ms per channel) than in the case of the single acquisition technique (approximately 6 ms per channel). Thus, the time for testing twenty-nine channels with the multi-acquisition technique amounts to approximately 800 ms, compared to a time of less than approximately 200 ms when the single acquisition technique is used. The test time that can be saved using the single acquisition technique over the multi-acquisition technique increases with the number of channels to be tested, at a rate of roughly 22 ms per channel. This is schematically shown in FIG. 7, which is a diagram of test time saving as a function of the number of channels to be tested.

Figure 8:
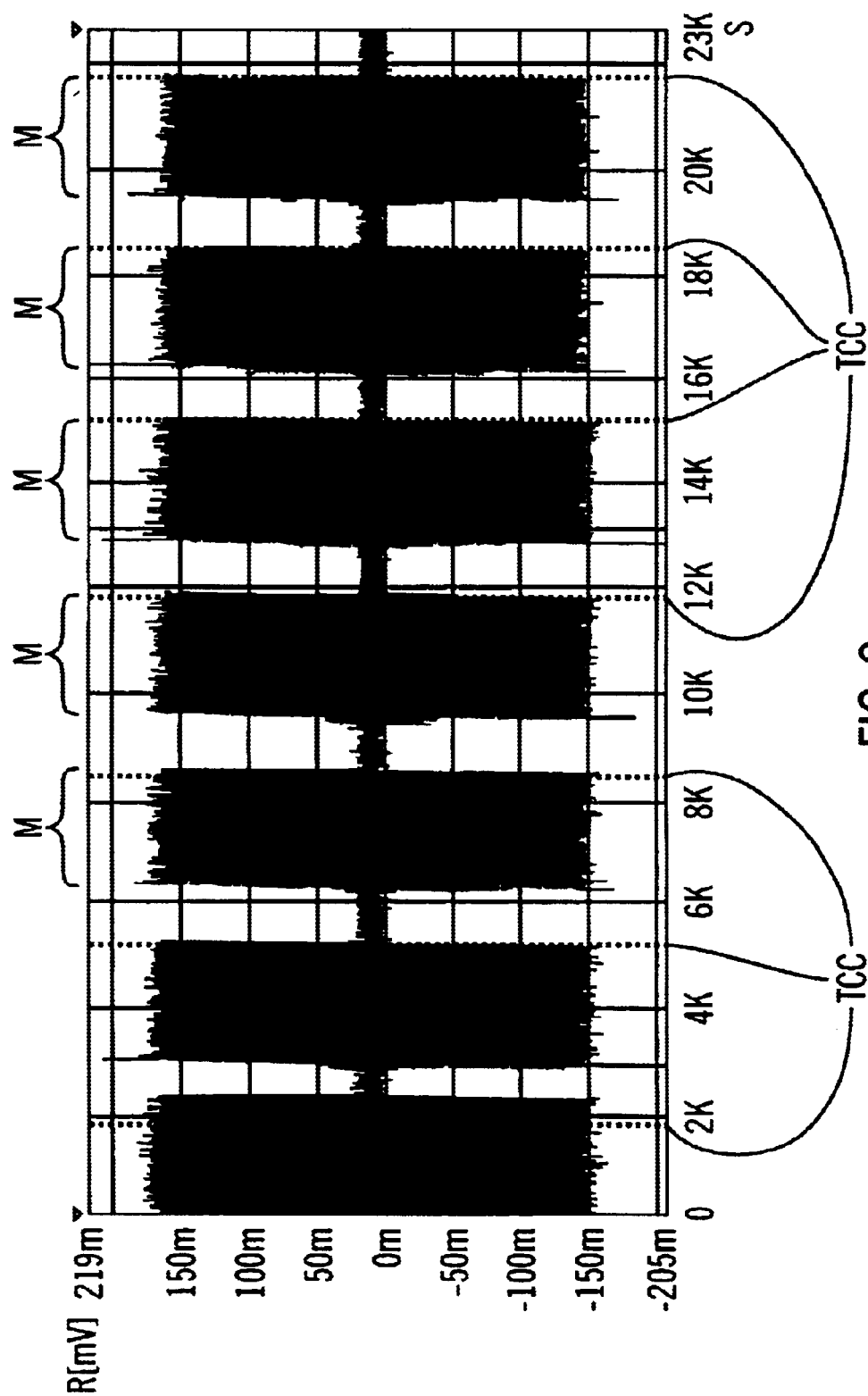
FIG. 8 is a timing diagram of a characteristic quantity of an integrated circuit submitted to a test program according to an embodiment of the testing method of the present invention.

FIG. 8 is a diagram showing the response R of the integrated circuit to six different test condition setups, that is, the response of six different channels of the integrated circuit in this example. The abscissa represents the number of samples S. TCC indicates the instants at which the test conditions are changed, in synchrony with the synchronization signal, while the measurement time for each channel is indicated as M.

Using the test method of the present invention, the time required for testing all of the twenty-nine channels is approximately equal to that obtainable by using the single acquisition technique, and thus significantly lower than that obtainable by using the multi-acquisition technique.

Therefore, the test method according to the present invention combines the advantages in terms of test time savings of the single acquisition technique, with the good performance in terms of stability in time acquisition and repeatability of the multi-acquisition technique.

Another advantage of the test method according to the present invention resides in the possibility of forecasting the test time, or the test time savings with respect to a multi-acquisition approach, for any number of measurements to be conducted. The inventors have found that the time required for performing a test using the test method of the present invention can in fact be expressed by the following relation:

$$T\text{test}=T1+Nch*(T2+T3)+T4$$

where T1 is the time required to perform the instrumentation set up, Nch is the number of different test condition setups to be implemented, T2 is the time necessary to perform the acquisition of the integrated circuit response to a given test condition setup, T3 is the time required to perform the mathematical calculation of the data acquired for a given test condition setup and T4 is the time required to reset the instruments. Considering again the practical example given above, the inventors have experimentally found the following values:

T1:31.6 ms;

T2:3.2 ms;

T3:2.5 ms; and

T4:2.7 ms.

The present invention generally applicable to the testing of any integrated circuit, in particular where the same measurement is to be conducted in different test conditions.

The test method of the present invention is not limited to the nature, analog or digital, of the electrical quantity or quantities to be measured: the sampling operated by the sampler instrument can be performed on either an analog quantity or a digital quantity.

While there has been illustrated and described what are presently considered to be the preferred embodiments of the present invention, it will be understood by those skilled in the art that various other modifications may be made, and equivalents may be substituted, without departing from the true scope of the present invention Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for testing an integrated circuit in an automatic test environment, said method comprising the steps of:

setting up the automatic test environment;

performing a measurement of at least one electrical quantity representative of a response of the integrated circuit to a set of prescribed integrated circuit test conditions;

resetting the automatic test environment; and changing the integrated circuit test conditions in synchrony with a synchronization signal having a prescribed periodicity, so that all of the measurements are allotted a time slot of the same length.

2. The method according to claim 1, further comprising the step of deriving the synchronization signal from a clock signal generated by a clock signal generator.

3. The method according to claim 2, wherein the clock signal generator is a digital pattern generator that performs a digital pattern scan.

4. The method according to claim 3, wherein the automatic test environment comprises a mixed-signal automatic test equipment apparatus in which the digital pattern generator is embedded.

5. The method according to claim 3, wherein in the step of changing the integrated circuit test conditions, a new prescribed integrated circuit test condition is set up in synchrony with the occurrence of a preselected digital vector in the digital pattern scan.

6. The method according to claim 5, wherein the setting step includes the sub-steps of:

setting up instruments of the automatic test environment;

starting a synchronization digital pattern scan in the automatic test environment; and starting an analog time acquisition procedure, the performing step includes the sub-steps of:

setting a prescribed integrated circuit test condition in synchrony with the synchronization digital pattern scan;

measuring a response of the integrated circuit to the set test condition;

repeating the sub-steps of setting a prescribed integrated circuit test condition and measuring a response for all of the prescribed integrated circuit test conditions;

terminating the analog time acquisition procedure;

terminating the synchronization digital pattern scan; and performing mathematical calculations on analog time responses of the integrated circuit to the set of integrated circuit test conditions, and the resetting step includes the sub-step of resetting the instruments.

7. The method according to claim 1, wherein the setting step includes the sub-steps of:

setting up instruments of the automatic test environment; and starting an analog time acquisition procedure, the performing step includes the sub-steps of:

setting a prescribed integrated circuit test condition in synchrony with the synchronization signal;

measuring a response of the integrated circuit to the set test condition;

repeating the sub-steps of setting a prescribed integrated circuit test condition and measuring a response for all of the prescribed integrated circuit test conditions; and performing mathematical calculations on the measured responses of the integrated circuit, and the resetting step includes the sub-step of resetting the instruments.

8. The method according to claim 1, further comprising the step of forecasting an integrated circuit test time by multiplying the time slot allotted to each measurement by the number of prescribed integrated circuit test conditions.

9. A computer program product for testing an integrated circuit in an automatic test environment, said computer program product comprising:

a storage medium readable by a processing circuit and storing instructions for execution by the processing circuit for performing a method comprising the steps of:

setting up the automatic test environment;

performing a measurement of at least one electrical quantity representative of a response of the integrated circuit to a set of prescribed integrated circuit test conditions;

resetting the automatic test environment; and changing the integrated circuit test conditions in synchrony with a synchronization signal having a prescribed periodicity, so that all of the measurements are allotted a time slot of the same length.

10. The computer program product according to claim 9, wherein the method further comprises the step of deriving the synchronization signal from a clock signal.

11. The computer program product according to claim 10, wherein in the step of changing the integrated circuit test conditions, a new prescribed integrated circuit test condition is set up in synchrony with the occurrence of a preselected digital vector in a digital pattern scan.

12. The computer program product according to claim 11, wherein the setting step of the method includes the sub-steps of:
- setting up instruments of the automatic test environment;
- starting a synchronization digital pattern scan in the automatic test environment; and
- starting an analog time acquisition procedure, the performing step of the method includes the sub-steps of:
- setting a prescribed integrated circuit test condition in synchrony with the synchronization digital pattern scan;
- measuring a response of the integrated circuit to the set test condition;
- repeating the sub-steps of setting a prescribed integrated circuit test condition and measuring a response for all of the prescribed integrated circuit test conditions;
- terminating the analog time acquisition procedure;
- terminating the synchronization digital pattern scan; and
- performing mathematical calculations on analog time responses of the integrated circuit to the set of integrated circuit test conditions, and the resetting step of the method includes the sub-step of resetting the instruments.

13. The computer program product according to claim 9, wherein the method further comprises the step of forecasting an integrated circuit test time by multiplying the time slot allotted to each measurement by the number of prescribed integrated circuit test conditions.

14. An automatic test equipment apparatus for testing an integrated circuit, said apparatus comprising:
- first means for putting the integrated circuit in a set test condition;
- sampling circuitry for measuring a response of the integrated circuit to the test condition; and
- a synchronization generator coupled to the first means, the synchronization generator supplying at least one synchronization signal having a prescribed periodicity to the first means, wherein the first means changes the set test condition in synchrony with the at least one synchronization signal, so that all of the measurements are allotted a time slot of the same length.

15. The apparatus according to claim 14, wherein the synchronization generator is also coupled to the sampling circuitry.

16. The apparatus according to claim 14, further comprising a control unit coupled to the sampling circuitry, the control unit performing mathematical calculations on the measured response of the integrated circuit to the set test condition.

17. The apparatus according to claim 16, wherein the control unit sets up instruments of the automatic test equipment apparatus and resets the instruments.

18. The apparatus according to claim 16, wherein the control unit operates to control the apparatus so as to:
- set up instruments of the automatic test equipment apparatus;
- start a synchronization digital pattern scan;
- start an analog time acquisition procedure;
- set a prescribed test condition in synchrony with the synchronization digital pattern scan;
- measure a response of the integrated circuit to the set test condition;
- repeat the setting of a prescribed test condition and measuring of a response for all of the prescribed test conditions; and
- reset the instruments.

19. The apparatus according to claim 14, wherein the synchronization generator derives the at least one synchronization signal from a clock signal.

20. The apparatus according to claim 14, further comprising a digital pattern generator that performs a digital pattern scan, the synchronization generator deriving the at least one synchronization signal from the digital pattern scan.

21. The apparatus according to claim 20 wherein the first means changes the set test condition by setting up a new condition in synchrony with the occurrence of a preselected digital vector in the digital pattern scan.

* * * * *